US012599971B2

(12) United States Patent
Von Fieandt et al.

(10) Patent No.: US 12,599,971 B2
(45) Date of Patent: *Apr. 14, 2026

(54) COATED CUTTING TOOL

(71) Applicant: AB SANDVIK COROMANT, Sandviken (SE)

(72) Inventors: Linus Von Fieandt, Sandviken (SE); Raluca Morjan Brenning, Sandviken (SE); Jan Engqvist, Sandviken (SE)

(73) Assignee: AB Sandvik Coromant, Sandviken (SE)

( * ) Notice: Subject to any disclaimer, the term of this patent is extended or adjusted under 35 U.S.C. 154(b) by 229 days.

This patent is subject to a terminal disclaimer.

(21) Appl. No.: 18/563,474

(22) PCT Filed: May 25, 2022

(86) PCT No.: PCT/EP2022/064146
§ 371 (c)(1),
(2) Date: Nov. 22, 2023

(87) PCT Pub. No.: WO2022/248526
PCT Pub. Date: Dec. 1, 2022

(65) Prior Publication Data
US 2024/0238875 A1      Jul. 18, 2024

(30) Foreign Application Priority Data

May 27, 2021      (EP) ..................................... 21176131

(51) Int. Cl.
*B23B 27/14*          (2006.01)
*C23C 16/02*          (2006.01)
(Continued)

(52) U.S. Cl.
CPC ........ *B23B 27/148* (2013.01); *C23C 16/0272* (2013.01); *C23C 16/308* (2013.01); (Continued)

(58) Field of Classification Search
CPC .......................................... C23C 16/30–16/36
See application file for complete search history.

(56) References Cited

U.S. PATENT DOCUMENTS 6,251,508 B1 *    6/2001    Ruppi ................... C23C 30/005
                                                    428/323
2008/0057280 A1    3/2008    Wantanabe et al.
(Continued)

FOREIGN PATENT DOCUMENTS

EP          1008673 A1      6/2000
EP          2604720 A1      6/2013
(Continued)

OTHER PUBLICATIONS

Paseuth et al: "Improvement of mechanical properties and cutting performance of modified MT-TiCxN1-xcoating by moderate temperature chemical vapor deposition", Surface and Coatings Technology, Elsevier, NL, vol. 291, Feb. 15, 2016, pp. 54-61.
(Continued)

*Primary Examiner* — Prashant J Khatri
(74) *Attorney, Agent, or Firm* — Corinne R. Gorski

(57)          ABSTRACT

A cutting tool includes a substrate at least partially coated with a coating. The substrate is a cemented carbide, cermet or ceramic. The coating includes a layer of Ti(C,N), a layer of $Al_2O_3$ and there between a bonding layer. The Ti(C,N) layer is composed of columnar grains, wherein an average grain size $D_{422}$ of the Ti(C,N) layer is 25-50 nm, and wherein the Ti(C,N) layer includes a portion B1 that is adjacent to the bonding layer. An average grain size of the Ti(C,N) grains in portion B1 is larger than the average grain size $D_{422}$ in the whole Ti(C,N) layer. In the portion B1 of Ti(C,N) layer the Ti(C,N) grains has an average grain size of 140-300 nm.

13 Claims, 5 Drawing Sheets

(51) Int. Cl.

| | |
|---|---|
| *C23C 16/30* | (2006.01) |
| *C23C 16/34* | (2006.01) |
| *C23C 16/36* | (2006.01) |
| *C23C 16/40* | (2006.01) |
| *C23C 16/56* | (2006.01) |

(52) U.S. Cl.

CPC .............. *C23C 16/34* (2013.01); *C23C 16/36* (2013.01); *C23C 16/403* (2013.01); *C23C 16/56* (2013.01); *B23B 2228/105* (2013.01)

(56) References Cited

U.S. PATENT DOCUMENTS

| | | | |
|---|---|---|---|
| 2013/0216777 A1 | 8/2013 | Jiang et al. | |
| 2015/0158094 A1* | 6/2015 | Igarashi | .............. C23C 16/0272 |
| | | | 427/249.19 |
| 2016/0175940 A1 | 6/2016 | Lindahl et al. | |
| 2018/0002817 A1 | 1/2018 | Lindahl et al. | |
| 2020/0308707 A1 | 10/2020 | Morjan Brenning | |
| 2021/0046554 A1 | 2/2021 | Rikiso et al. | |

FOREIGN PATENT DOCUMENTS

| | | | | |
|---|---|---|---|---|
| EP | 2791387 A1 | 6/2013 | | |
| EP | 2891536 A1 * | 7/2015 | ............. | C23C 16/36 |
| EP | 3034653 A1 | 6/2016 | | |

OTHER PUBLICATIONS

Toller Lisa et al; "Investigation of cemented carbides with alternative binders after CVD coating", International Journal of Refractory Metals and Hard Metals, Elsevier, Amsterdam, NL. vol. 62, Jul. 5, 2016, pp. 225-229.

Von Fieandt L et al: "Chemical vapor deposition of TiN on transition metal substrates", Surfaces and Coatings Technology, vol. 334, Jan. 2, 2017, pp. 373-383.

Zhixing Guo et al: "Adherent Ti (C,N) Coatings on Cemented Carbide Substrates with Fe/Ni/Co Binder", Metallurgical and Materials Transactions B, Springer-Verlag, New York, vol. 40, No. 6, Aug. 26, 2009, pp. 871-876.

Shoja S. et al. "Calculated and experimental Schmid factors for chip flow deformation of textured CVD [alpha'-alumina coatings", Surface and Coatings Technology, vol. 412, 2021-047-01, pp. 126991, XP055844018.

M'Saoubi et al.: "Microstructure and wear mechanisms of texture-controlled CVD [alpha]-Al2O3coatings", Wear, Elsevier Sequoia, Lausanne, CH, Jun. 15, 2017, XP085091662.

You Yu et al: "Highly (001)-oriented [alpha]-Al2o3 films prepared by laser chemical vapor deposi", Materials Letters, Elsevier, Amsterdam, NL, vol. 106, pp. 11-13, May 19, 2013.

* cited by examiner

COATED CUTTING TOOL

RELATED APPLICATION DATA

This application is a § 371 National Stage Application of PCT International Application No. PCT/EP2022/064146 filed May 25, 2022 with priority to EP 21176131.7 filed May 27, 2021. This application is related to co-pending U.S. patent application Ser. No. 18/563,571, filed on Nov. 22, 2023, Ser. No. 18,563,612, filed on Nov. 22, 2023, Ser. No. 18/563,259, filed on Nov. 21, 2023, and Ser. No. 17/613,213 filed on Nov. 22, 2021.

TECHNICAL FIELD

The present invention relates to a coated cutting tool comprising a substrate and a coating, wherein the coating is deposited by CVD and comprises a Ti(C,N) layer and an $\alpha$-Al$_2$O$_3$-layer.

BACKGROUND

In the metal cutting industry coated cutting tools are well known in the art. CVD coated cutting tools and PVD coated cutting tools are the two most dominating types of coated cutting tools. Advantages with these coatings are high resistance to chemical and abrasive wear which are important to achieve long tool life of the coated cutting tool. CVD coatings comprising a layer of Ti(C,N) together with a layer of alumina are known to perform well in for example turning or milling in steel.

EP2791387A1 discloses a coated cutting tool provided with a fine-grained titanium carbonitride layer. The coating is advantageous in showing high resistance to flaking in turning of nodular cast iron and in high speed cutting. A columnar CVD TiCN layer is described with an average grain width of 0.05-0.4 µm.

Recent studies have shown that the combination of a very fine grained Ti(C,N) layer and a Al$_2$O$_3$ layer sometimes lead to poor adhesion between the Ti(C,N) and the Al$_2$O$_3$. It is of interest to address this issue as a very fine grained Ti(C,N) has shown promising cutting tool properties.

It is an object of the present invention to provide a coated cutting tool for metal cutting with a high adhesion of the layers of the coating. It is a further object to provide a coated cutting tool with high wear resistance, especially with high resistance to flaking during metal cutting. It is also an object of the present invention to provide a cutting tool with high resistance to crater wear in metal cutting in steel.

SUMMARY OF THE INVENTION

The present invention relates to a cutting tool comprising a substrate at least partially coated with a coating, said coating comprising a layer of Ti(C,N), a layer of Al$_2$O$_3$ and there between a bonding layer, wherein said Ti(C,N) layer with a thickness of 3-25 µm is composed of columnar grains, wherein an average grain size $D_{422}$ of the Ti(C,N) layer is 25-50 nm, as measured with X-ray diffraction with CuK$\alpha$ radiation, the grain size $D_{422}$ is calculated from the full width at half maximum (FWHM) of the (422) peak according to Scherrer's equation:

$$D_{422} = \frac{K\lambda}{B_{422}\cos\theta}$$

wherein $D_{422}$ is the average grain size of the Ti(C,N), K is the shape factor here set at 0.9, $\lambda$ is the wave length for the CuK$\alpha$ radiation here set at 1.5405 Å, $B_{422}$ is the FWHM value for the (422) reflection and $\theta$ is the Bragg angle, wherein the Ti(C,N) layer comprises a portion B1 that is adjacent to the bonding layer, and wherein an average grain size of the Ti(C,N) grains in portion B1 is larger than the average grain size $D_{422}$ over the whole thickness of the Ti(C,N) layer, in the portion B1 of Ti(C,N) layer the Ti(C,N) grains has an average grain size of 140-300 nm as measured in the portion B1 of the Ti(C,N) layer, within 0.5 µm from the bonding layer, as measured by counting the number of grains along a line in a SEM micrograph at a 15.000× magnification, wherein said line is parallel with the substrate surface.

The present invention provides an increased adhesion between a very fine grained Ti(C,N) layer and a $\alpha$-Al$_2$O$_3$ layer. This increased adhesion is achieved by at the end of the Ti(C,N) deposition change the deposition process conditions so that some of the fine Ti(C,N) grains widens and a more coarse grained Ti(C,N) portion is formed. Thereafter the process conditions are changed again, this time to provide an optimal outer surface of the Ti(C,N) grains. In this way an outermost surface of the Ti(C,N) is formed that is similar to the outermost surface of the coarse grained Ti(C,N) that is known to show high adhesion via the bonding layer to the $\alpha$-Al$_2$O$_3$ layer. If the average grain size in portion B1 is too small the adhesion to the subsequently deposited $\alpha$-Al$_2$O$_3$ layer is not increased. The average grain size in portion B1 is suitably smaller than 300 nm since this is advantageous for the wear resistance.

It is difficult to study the grain size of very fine grained Ti(C,N) in SEM since the resolution is limited. Here the average grain size of the fine grained portion of the Ti(C,N) layer is instead defined via XRD and Scherrer's equation. Even though the signal from the XRD also includes information from the coarser grained Ti(C,N) portion B1, this contribution is considered to be limited.

The study of the grain size in the coarse-grained portion B1 on the other hand had the challenges that it is just a portion of the Ti(C,N) layer and therefor a method with a high precision had to be selected.

In one embodiment of the present invention the thickness of the portion B1 of the Ti(C,N) layer as measured in the growth direction of the coating is 0.5-1.5 µm, preferably 0.6-0.9 µm, most preferably 0.6-0.8 µm.

Fine grained Ti(C,N) is advantageous as a wear resistant layer, which could be due to its high amount of grain boundaries or due to a more smooth or even thickness of the layer. The portion of the TiCN layer that is fine grained should therefore be relatively thick. The coarse-grained portion that is to contribute with an increased adhesion is to be relatively limited, preferably 0.5-1.5 µm, more preferably 0.6-0.9 µm, most preferably 0.6-0.8 µm, in thickness of the portion B1. If the portion B1 is too thin the adhesion will not be enhanced.

In one embodiment of the present invention the bonding layer comprises at least one compound selected from the group of titanium carboxide, titanium oxynitride and titanium carboxynitride.

A bonding layer of titanium carboxide, titanium oxynitride or titanium carboxynitride is advantageous in that it can provide an epitaxial relation between the Ti(C,N) layer and the $\alpha$-Al$_2$O$_3$ layer.

In one embodiment of the present invention the grain size $D_{422}$ of Ti(C,N) is 25-40 nm, preferably 25-35 nm.

The present invention with increasing the adhesion between a fine grained Ti(C,N) and an α-Al₂O₃ layer is especially advantageous for Ti(C,N) layers with very fine grains such as when grain size $D_{422}$ of Ti(C,N) is 25-40 nm, or even 25-35 nm.

In one embodiment of the present invention the Ti(C,N) layer exhibits an X-ray diffraction pattern, as measured using CuKα radiation and θ-2θ scan, wherein the TC(hkl) is defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

where I(hkl) is the measured intensity (integrated area) of the (hkl) reflection, I0(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein TC(422) ≥3, preferably ≥4.

In one embodiment of the present invention the Al₂O₃ layer is a α-Al₂O₃ layer, preferably with an average thickness of the α-Al₂O₃ layer is 1 μm-15 μm, preferably 3-10 μm.

In one embodiment of the present invention the layer, wherein said α-Al₂O₃ layer exhibits a texture coefficient TC(hkl), as measured by X-ray diffraction using CuKα radiation and θ-2θ scan, defined according to Harris formula where I(hkl) is the measured intensity (integrated area) of the (hkl) reflection, I0(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) characterized in that TC(0 0 12) ≥7.5, preferably ≥7.7, more preferably ≥7.8.

In one embodiment of the present invention the layer, wherein said α-Al₂O₃ layer exhibits a TC(110) ≤0.2, preferably ≤0.1.

In one embodiment of the present invention the Ti(C,N) grains in the portion B1 of Ti(C,N) layer has an average grain size of 140 nm-175 nm. If the average grain size in portion B1 is too large the adhesion is still high, but it was found that the highest orientation of the subsequently deposited α-Al₂O₃ layer could not be reached.

In one embodiment of the present invention an average thickness of the Ti(C,N) layer is 4-20 μm, preferably 5-15 μm.

In one embodiment of the present invention an average thickness of the bonding layer is 0.25-2.5 μm, preferably 0.5-2.0 μm.

In one embodiment of the present invention an average thickness of the coating is 5.0 μm-30.0 μm, preferably 10-20 μm.

In one embodiment of the present invention said substrate is of cemented carbide, cermet or ceramic.

The atomic ratio of carbon to the sum of carbon and nitrogen (C/(C+N)) contained in the Ti(C,N) layer of the present invention is preferably 0.50-0.65, more preferably 0.55-0.62 as measured by electron microprobe analysis.

Still other objects and features of the present invention will become apparent from the following definitions and examples considered in conjunction with the accompanying drawings.

Definitions

The term "cutting tool" is herein intended to denote cutting tools suitable for metal cutting applications such as inserts, end mills or drills. The application areas can for example be turning, milling or drilling in metals such as steel.

Methods

Average Grain Size of Ti(C,N) Layer, $D_{422}$

In order to investigate the average grain size of the Ti(C,N) grains in the Ti(C,N) layer, X-ray diffraction (XRD) was conducted on the flank face using a PANalytical Cubix3 diffractometer equipped with a PIXcel detector. The coated cutting tool was mounted in sample holder to ensure that the flank face of the samples was parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the 2θ range 20° to 140°, i.e. over an incident angle θ range from 10 to 70°. The data analysis, including background fitting, Cu-Kα₂ stripping and profile fitting of the data, was done using PANalytical's X'Pert HighScore Plus software.

The integrated peak full width at half maximum for the profile fitted curve achieved from PANalytical's X'Pert HighScore Plus software was used to calculate the grain size of the layer according to the Scherrer equation (Eq1) (Birkholz, 2006).

The average grain size $D_{422}$ is calculated from the full width at half maximum (FWHM) of the (422) peak according to Scherrer's equation:

$$D_{422} = \frac{K\lambda}{B_{422}\cos\theta} \quad (1)$$

wherein $D_{422}$ is the mean grain size of the Ti(C,N), K is the shape factor here set at 0.9, A is the wave length for the CuKα₁ radiation here set at 1.5405 Å, $B_{422}$ is the FWHM value for the (422) reflection and θ is the Bragg angle i.e the incident angle.

The obtained FWHM from the measurement contains both broadening from the instrument and broadening caused by the small grain size. To compensate for this a gaussian approximation was used (Birkholz, 2006). $B_{422}$ is the line broadening (in radians) at FWHM after subtracting the instrumental broadening (0.00174533 radians) and is defined in equation (2):

$$B_{422} = \sqrt{((FWHM_{obs})^2 - (FWHM_{ins})^2)} \quad (2)$$

where $B_{422}$ is the broadening (in radians) used for the grain size calculation, $FWHM_{obs}$ is the measured broadening (in radians), $FWHM_{ins}$ is the instrumental broadening (in radians).

Since possible further layers above the Ti(C,N)-layer will affect the X-ray intensities entering the Ti(C,N)-layer and exiting the whole coating, corrections need to be made for these, taken into account the linear absorption coefficient for the respective compound in a layer. Alternatively, a further layer, above the Ti(C,N)-single-layer can be removed by a method that does not substantially influence the XRD measurement results, e.g. chemical etching.

Grain Size of Portion B1 of Ti(C,N)

In the uppermost region of the Ti(C,N) layer, region B1, located closest to the bonding layer that is to bond the $Al_2O_3$ layer to the Ti(C,N) layer, the grains of the Ti(C,N) are enlarged to improve the adhesion. The average grain size of the Ti(C,N) grains in this area is analysed by identifying grain boundaries and counting grains along a line in a cross-sectional SEM micrograph and dividing the length of the line with the number of grains.

The as coated inserts were mounted in a black conductive phenolic resin from AKASEL which were afterwards ground down 1 mm and then polished in two steps: rough polishing (9 μm) and fine polishing (1 μm) using a diamond slurry solution. To observe layers microstructure the samples were further polished using a colloidal silica suspension (MasterPolish 2). The polishing was performed until a scratch free cross section was acquired. The samples were afterwards cleaned with deionized water and detergent to remove residual polishing suspension and dried with clean air spray.

The SEM used for the grain size study was a Carl Zeiss AG-Supra 40 type operated at 3 kV acceleration voltage using a 30 μm aperture. The SEM images were acquired at 15.000× magnification and between about 5 and 10 mm working distance. A horizontal line of at least 7.5 μm intersecting the Ti(C,N) grains in the upper part of portion B1 right below the bonding layer was drawn on the SEM image as is shown in FIG. 1. The grains crossing the horizontal line were counted and the average grain size was calculated by dividing the number of grains with the length of the line and are given in table 5. To obtain a better statistics, the grains crossing the horizontal line were counted for two different randomly chosen regions for each sample.

X-Ray Diffraction Measurement of Ti(C,N) and $Al_2O_3$

In order to investigate the texture of the layer(s), X-ray diffraction was conducted on the flank face of cutting tool inserts using a PANalytical CubiX3 diffractometer equipped with a PIXcel detector. The coated cutting tool insert was mounted in a sample holder to ensure that the flank face of the cutting tool insert was parallel to the reference surface of the sample holder and also that the flank face was at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-Kα$_2$ stripping and profile fitting of the data, was done using PANalytical's X'Pert HighScore Plus software. A general description of the fitting is made in the following. The output (integrated peak areas for the profile fitted curve) from this program was then used to calculate the texture coefficients of the layer by comparing the ratio of the measured intensity data to the standard intensity data according to a PDF-card of the specific layer (such as a layer of Ti(C,N) or α-$Al_2O_3$), using the Harris formula (3) as disclosed below. Since the layer is finitely thick the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-$Al_2O_3$ layer will affect the X-ray intensities entering the α-$Al_2O_3$ layer and exiting the whole coating, corrections need to be made for these as well, taken into account the linear absorption coefficient for the respective compound in a layer. The same applies for X-ray diffraction measurements of a Ti(C,N) layer if the Ti(C,N) layer is located below for example an α-$Al_2O_3$ layer. Alternatively, a further layer, such as TiN, above an alumina layer can be removed by a method that does not substantially influence the XRD measurement results, e.g. chemical etching.

In order to investigate the texture of the α-$Al_2O_3$ layer X-ray diffraction was conducted using CuKα radiation and texture coefficients TC(hkl) for different growth directions of the columnar grains of the α-$Al_2O_3$ layer were calculated according to Harris formula (3):

$$TC(hkl) = \frac{I(hkl)}{I_0(hkl)} \left[ \frac{1}{n} \sum_{n=1}^{n} \frac{I(hkl)}{I_0(hkl)} \right]^{-1} \tag{3}$$

where I(hkl)=measured (integrated area) intensity of the (hkl) reflection, $I_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 16), (2 1 4), (3 0 0) and (0 0 12). The measured integrated peak area is thin film corrected and corrected for any further layers above (i.e. on top of) the α-$Al_2O_3$ layer before said ratio is calculated.

The texture coefficients TC(hkl) for different growth directions of the columnar grains of the Ti(C,N) layer were calculated according to Harris formula (3) as disclosed earlier, where I(hkl) is the measured (integrated area) intensity of the (hkl) reflection, $I_0$(hkl) is the standard intensity according to ICDD's PDF-card no 42-1489, n is the number of reflections to be used in the calculation. In this case the (hkl) reflections used are (1 1 1), (2 0 0), (2 2 0), (3 1 1), (3 3 1), (4 2 0) and (4 2 2).

It is to be noted that peak overlap is a phenomenon that can occur in X-ray diffraction analysis of coatings comprising for example several crystalline layers and/or that are deposited on a substrate comprising crystalline phases, and this has to be considered and compensated for. An overlap of peaks from the α-$Al_2O_3$ layer with peaks from the Ti(C,N) layer might influence measurement and needs to be considered. It is also to be noted that for example WC in the substrate can have diffraction peaks close to the relevant peaks of the present invention.

BRIEF DESCRIPTION OF DRAWINGS

Embodiments of the invention will be described with reference to the accompanying drawings, wherein.

EXAMPLES

Figure 1:
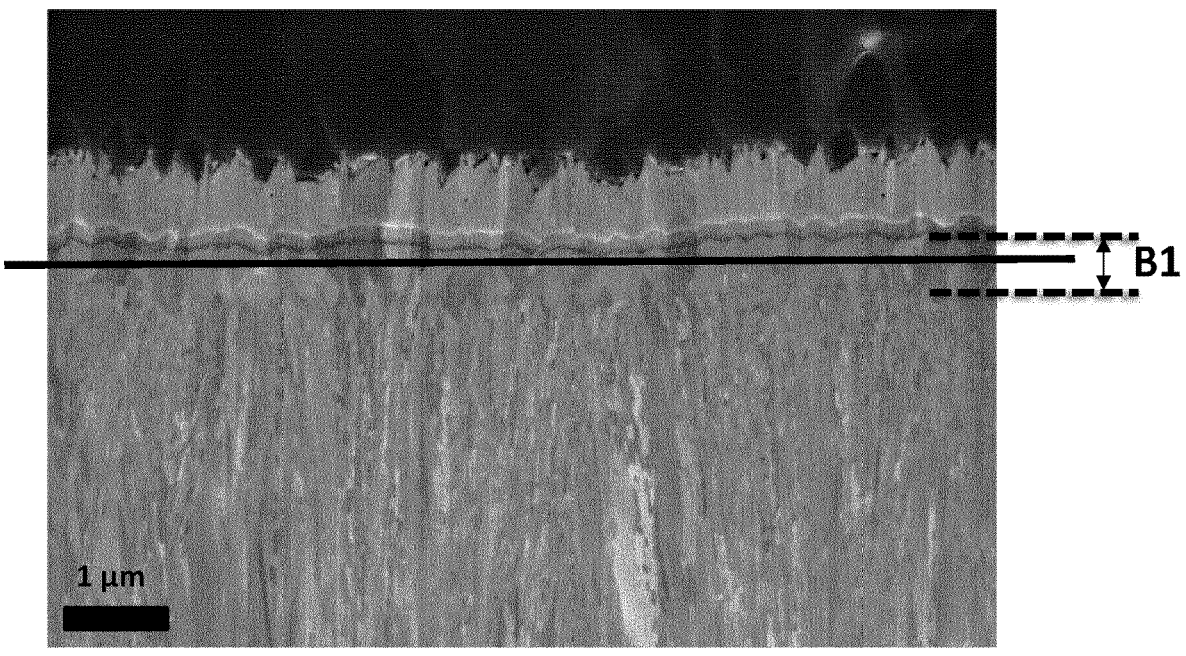
FIG. 1 shows a Scanning Electron Microscope (SEM) image of a cross section of an example of the inventive coating, Sample D, where the measurement of the amount of Ti(C,N) grains crossing the line parallel to the substrate is illustrated in the portion B1.
Figure 2:
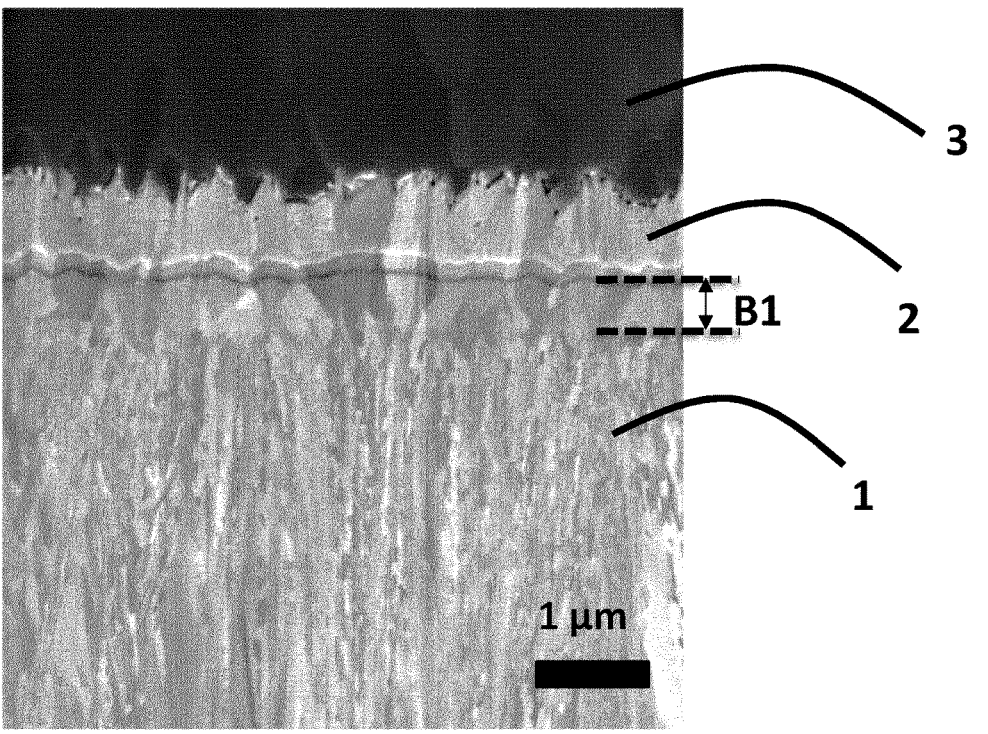
FIG. 2 shows a Scanning Electron Microscope (SEM) image of a cross section of an example of the inventive coating, Sample D, where the portion B1 of the Ti(C,N) layer (1), the bonding layer (2) and the α-$Al_2O_3$ layer (3) are indicated.
Figure 3:
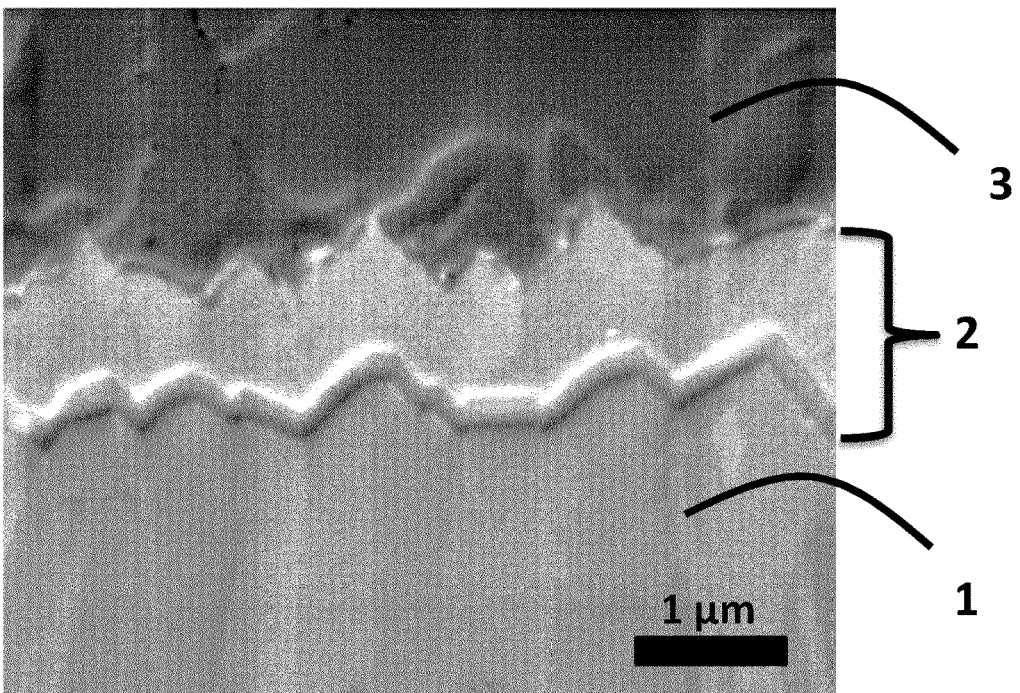
FIG. 3 shows a Scanning Electron Microscope (SEM) image of a cross section of an example of a reference coating, Sample A, where the uppermost Ti(C,N) (1), the bonding layer (2) and the lowermost α-$Al_2O_3$ (3) is visible.
Figure 4:
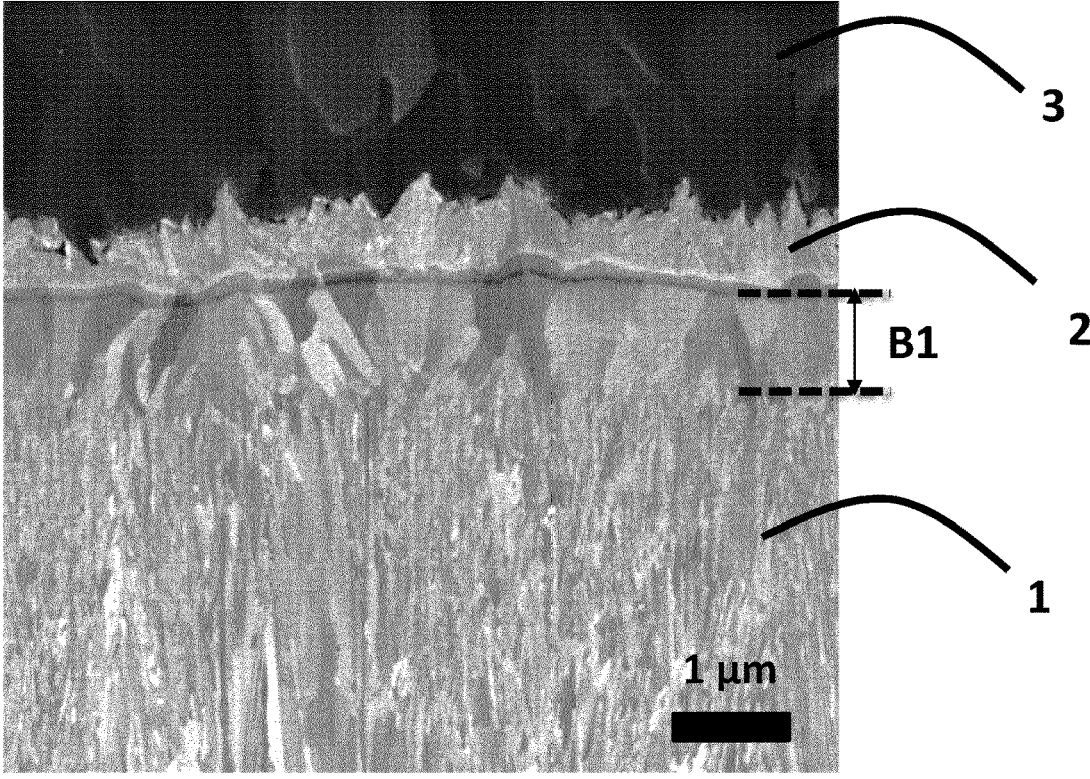
FIG. 4 shows a Scanning Electron Microscope (SEM) image of a cross section of an example of the inventive coating, Sample G, where the portion B1 of the Ti(C,N) layer (1), the bonding layer (2) and the α-Al₂O₃ layer (3) are indicated.
Figure 5:
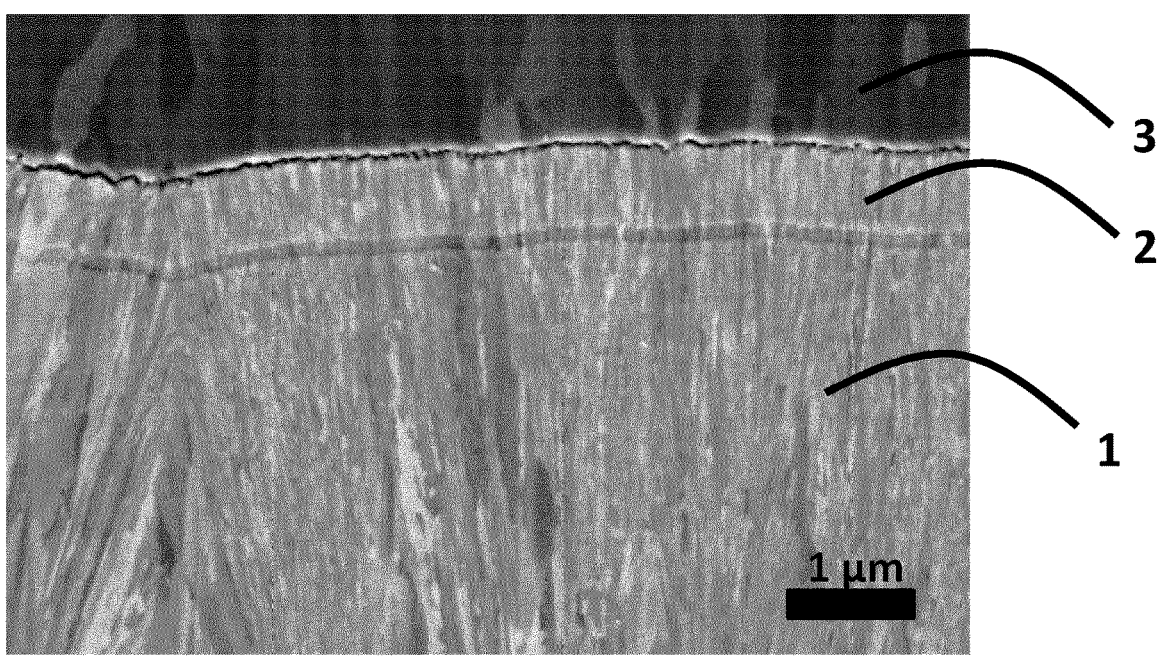
FIG. 5 shows a Scanning Electron Microscope (SEM) image of a cross section of an example of a reference coating, Sample B, where the uppermost Ti(C,N) (1), the bonding layer (2) and the lowermost α-Al₂O₃ (3) is visible.
Figure 6:
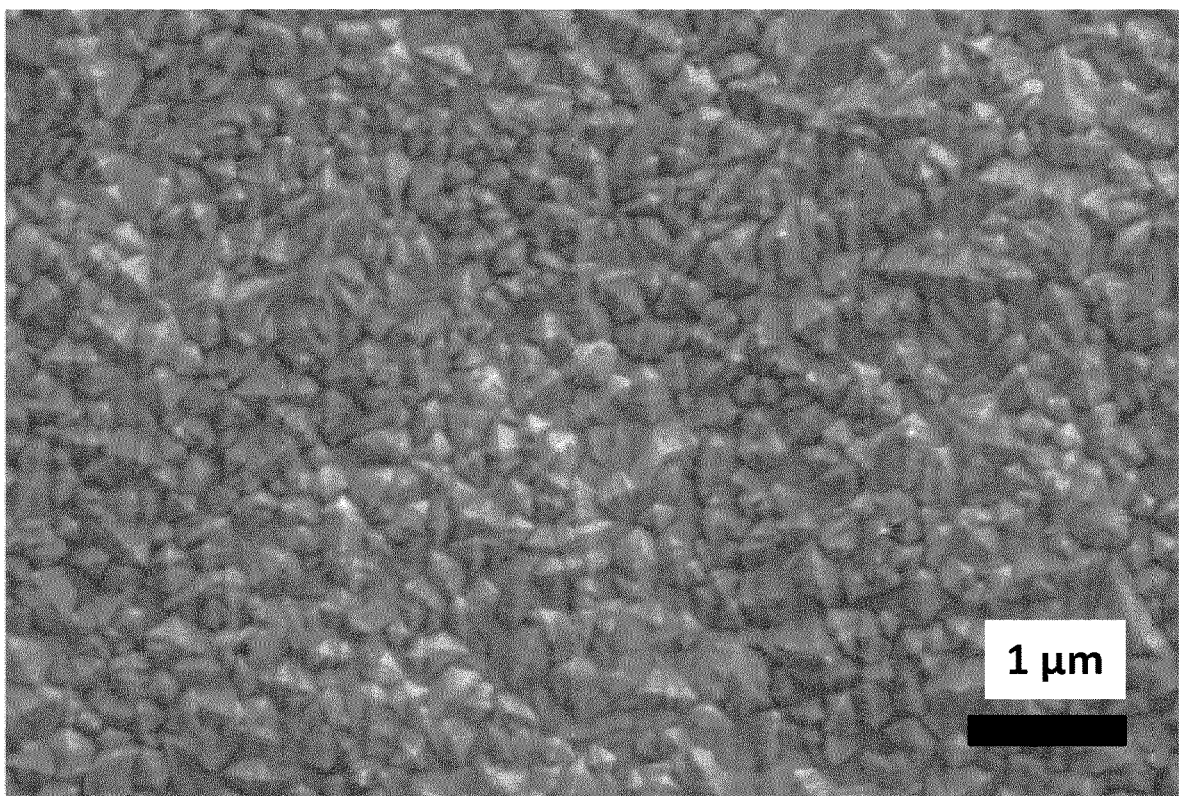
FIG. 6 shows a Scanning Electron Microscope (SEM) image of a top surface of portion B1 of a sample provided with a Ti(C,N) layer corresponding to the Ti(C,N) in sample D where the morphology of the outermost surface of the portion B1 is visible.
Figure 7:
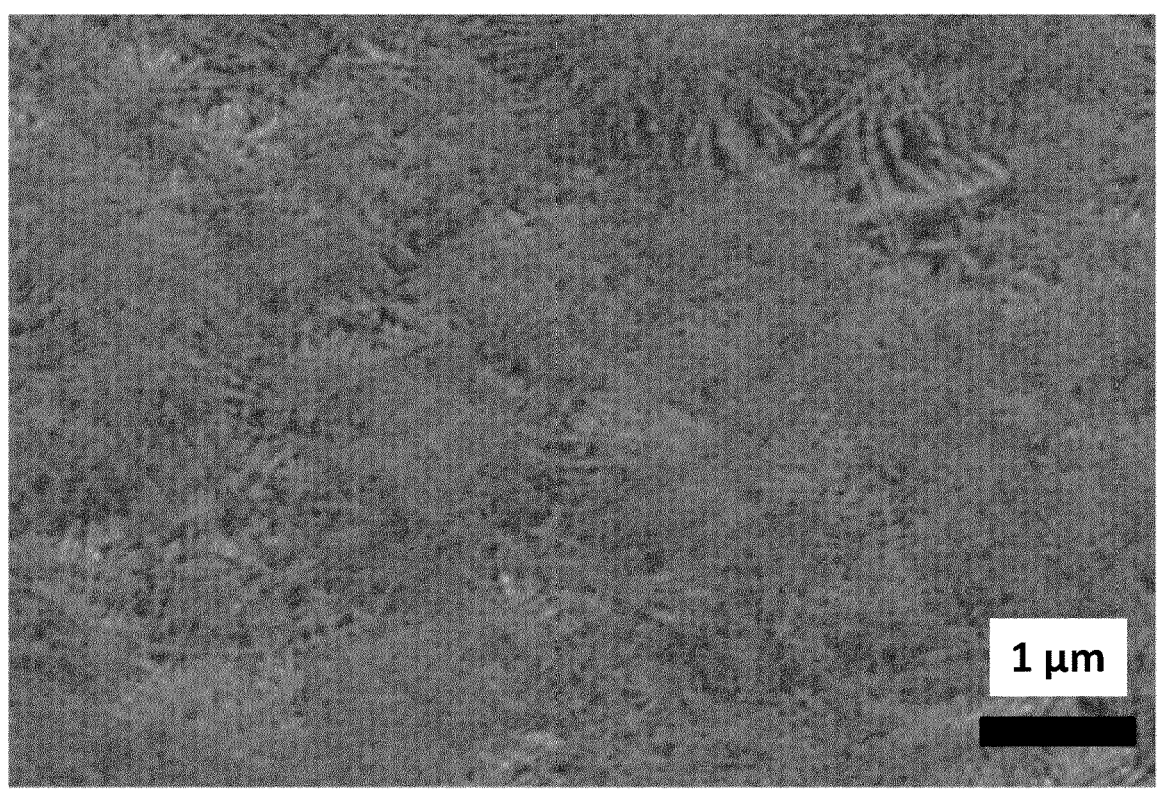
FIG. 7 shows a Scanning Electron Microscope (SEM) image of a top surface of the Ti(C,N) layer of a sample provided with a Ti(C,N) layer corresponding to the Ti(C,N) in sample B where the morphology of the outermost surface of the very fine grained Ti(C,N) is visible.
Figure 8:
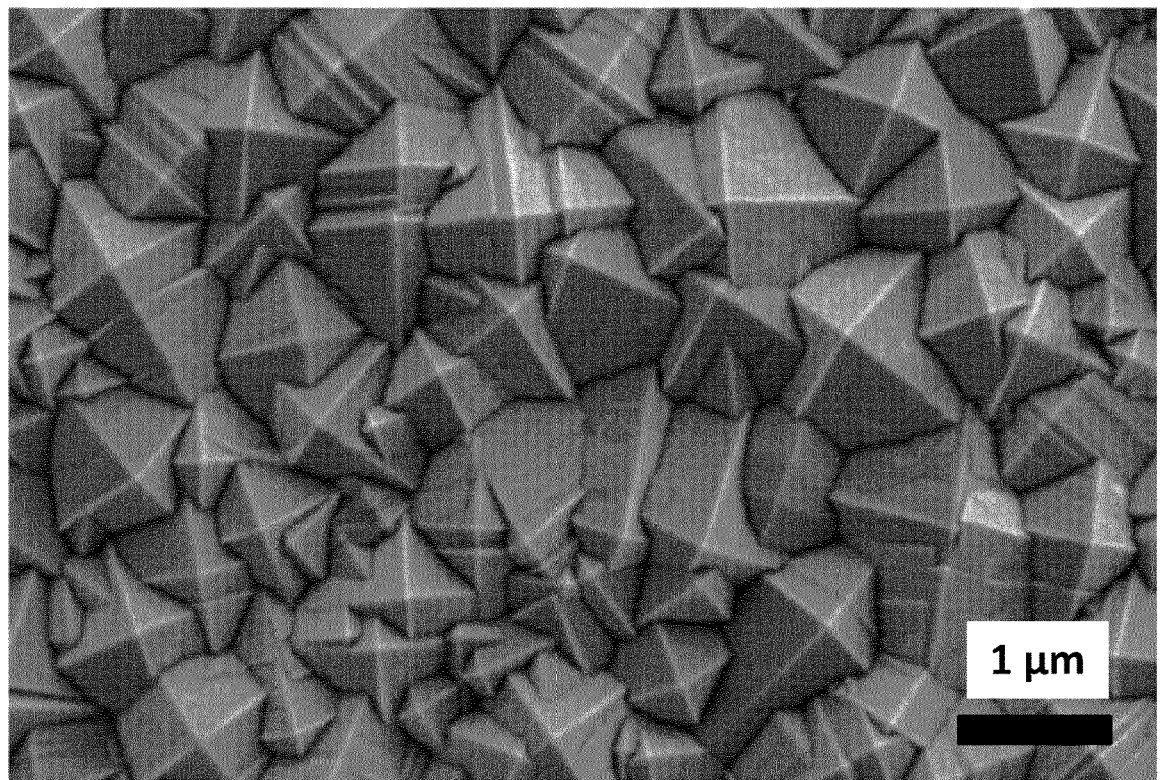
FIG. 8 shows a Scanning Electron Microscope (SEM) image of a top surface of the Ti(C,N) layer of a sample provided with a Ti(C,N) layer corresponding to the Ti(C,N) in the reference sample A where the morphology of the outermost surface of the coarse grained Ti(C,N) is visible.
Figure 9:
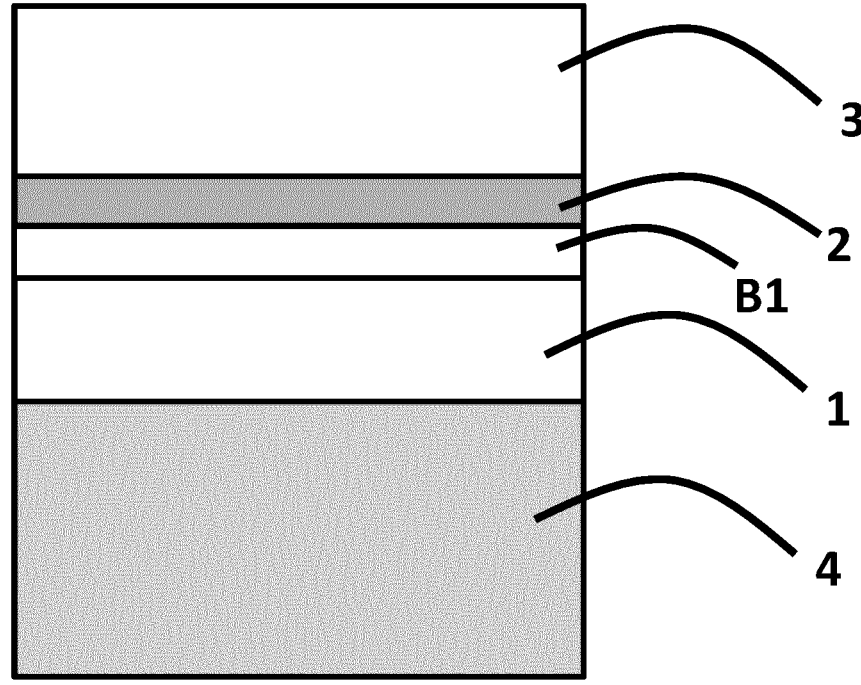
FIG. 9 is a schematic overview showing the position of the layers and portions of the present invention, the Ti(C,N) layer (1), the portion B1 of the Ti(C,N) layer (1), the bonding layer (2), the α-Al₂O₃ layer (3) and the substrate (4).

Exemplifying embodiments of the present invention will now be disclosed in more detail and compared to reference embodiments. Coated cutting tools (inserts) were manufactured, analysed and tested in cutting tests.

Cemented carbide substrates were manufactured utilizing conventional processes including milling, mixing, spray drying, pressing and sintering. The ISO-type geometry of the cemented carbide substrates (inserts) was CNMG-120408-PM. The composition of the cemented carbide was 7.2 wt % Co, 2.9 wt % TaC, 0.5 wt % NbC, 1.9 wt % TiC, 0.4 wt % TiN and the rest WC.

Before the coating depositions the substrates were exposed to a mild blasting treatment to remove any residuals on the substrate surfaces from the sintering process.

CVD Depositions

The sintered substrates were CVD coated in a radial CVD reactor of Ionbond Type size 530 capable of housing 10.000 half inch size cutting inserts. The samples to be tested and analysed further were selected from the middle of the chamber and at a position along half the radius of the plate between the center and the periphery of the plate. Mass flow controllers were chosen so that the high flow of for example CH₃CN could be set.

A first innermost coating of about 0.2 μm TiN was deposited on all substrates in a process at 400 mbar and 885° C. A gas mixture of 48.8 vol % H₂, 48.8 vol % N₂ and 2.4 vol % TiCl₄ was used.

Thereafter followed the Ti(C,N) layer deposition, and all samples A-G were deposited with different Ti(C,N) in accordance with the following. The reference sample A was deposited with the process steps V and W as shown in Table 1. The temperature adjustment from 885° C. to 870° C. before starting with process step X for the samples B-G was made in 50 vol % H₂ and 50 vol % N₂ at 80 mbar. The Ti(C,N) layer of reference sample B was deposited with the process step X as shown in Table 1. On samples C-G the Ti(C,N) layers were deposited with the process steps X, Y and Z using the deposition times as indicated in Tables 1 and 2. The process times were adjusted to reach about the same total Ti(C,N) layer thickness for all the samples.

TABLE 1

| Parameter | Process step X | Process step Y | Process step Z | Process step V | Process step W |
|---|---|---|---|---|---|
| H₂ | Balance | Balance | Balance | Balance | Balance |
| N₂ | | 42.97% | 7.76% | 37.57% | 7.76% |
| TiCl₄ | 2.95% | 1.17% | 2.38% | 2.95% | 2.38% |
| CH₃CN | 0.45% | 2.08% | 0.65% | 0.45% | 0.65% |
| HCl | | 10.82% | 7.76% | | 7.76% |
| Total gas flow [l/h] | 5600 | 3421 | 7734 | 5590 | 7734 |
| Pressure [mbar] | 80 | 70 | 70 | 55 | 55 |
| Temperature [° C.] | 870 | 870 | 870 | 885 | 885 |
| Process time [min] | See Table 2 | | 15 | 10 | 270 |

TABLE 2

| Sample | Process step X [minutes] | Process step Y [minutes] |
|---|---|---|
| B | 260 | — |
| C | 243 | 5 |
| D | 240 | 15 |
| E | 238 | 20 |
| F | 235 | 30 |
| G | 230 | 45 |

A 0.7-0.9 μm thick bonding layer was deposited at 1000° C. on top of the Ti(C,N) layer by a process consisting of four separate reaction steps. First a 8 minutes HTCVD Ti(C,N) step using TiCl₄, CH₄, N₂, HCl and H₂ at 400 mbar, then a second step (Ti(C,N,O)-1) using TiCl₄, CH₃CN, CO, N₂ and H₂ at 70 mbar for 7 minutes, then a third step (Ti(C,N,O)-2) using TiCl₄, CH₃CN, CO, N₂ and H₂ at 70 mbar for 5 minutes and finally a fourth step (TiN) using TiCl₄, N₂ and H₂ at 70 mbar for 6 minutes. During the third deposition step the CO gas flow was continuously linearly increased from a start value to a stop value as shown in Table 3. All other gas flows were kept constant, but since the overall gas flow is increased, the concentration of all gases were somewhat influenced due to this. Prior to the start of the subsequent Al₂O₃ nucleation, the bonding layer was oxidized for 4 minutes in a mixture of CO₂, CO, N₂ and H₂.

The details of the bonding layer deposition are shown in Table 3.

TABLE 3

| Bonding layer | Pressure[mbar] | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|---|
| | | | | | | Bonding layer deposition | | | |
| Temp. increase | 55 | Balance | 25 | | | | | | |
| HTCVD Ti(C,N) | 400 | Balance | 25.5 | 3.4 | 1.7 | — | 1.55 | — | — |
| Ti(C,N,O)-1 | 70 | Balance | 12.0 | — | 1.2 | 1.2 | 1.5 | 0.40 | — |
| Ti(C,N,O)-2 | 70 | Balance | 31.5-30.6 | — | — | 1.6-4.6 | 3.15-3.06 | 0.65-0.63 | — |
| TiN | 70 | Balance | 32.3 | — | — | — | 3.23 | — | — |
| Oxidation | 55 | Balance | 30 | — | — | 12.5 | — | — | 3.7 |

On top of the bonding layer an $\alpha$-$Al_2O_3$ layer was deposited. All the $\alpha$-$Al_2O_3$ layers were deposited at 1000° C. and 55 mbar in two steps. The first step using 1.2 vol-% $AlCl_3$, 4.7 vol-% $CO_2$, 1.8 vol-% HCl and balance $H_2$ giving about 0.1 µm $\alpha$-$Al_2O_3$ and a second step as disclosed below giving a total $\alpha$-$Al_2O_3$ layer thickness of about 5 µm. The second step of the $\alpha$-$Al_2O_3$ layer was deposited using 1.16% $AlCl_3$, 4.65% $CO_2$, 2.91% HCl, 0.58% $H_2S$ and balance $H_2$.

Coating Analysis

The layer thicknesses were measured on the rake face of the cutting tool samples using a Scanning Electron Microscope. The layer thicknesses of the coating the samples A-G are shown in Table 4.

TABLE 4

| | TiN + Ti(C,N) + bonding layer thickness [µm] | Process times of steps Y/Z [min/min] | Thickness portion from step Y [µm] | Thickness portion from step Z [µm] | Thickness portion B1 [µm] | $Al_2O_3$ thickness [µm] |
|---|---|---|---|---|---|---|
| Sample | | | | | | |
| | | | | Layer thicknesses | | |
| A | 10.4 | 0/0 | — | — | — | 5.0 |
| B | 8.7 | 0/0 | — | — | — | 4.5 |
| C | 9.4 | 5/15 | ≈0.1 | ≈0.4 | ≈0.5 | 4.3 |
| D | 9.2 | 15/15 | ≈0.2 | ≈0.5 | ≈0.7 | 4.6 |
| E | 8.7 | 20/15 | ≈0.3 | ≈0.4 | ≈0.7 | 4.8 |
| F | 9.4 | 30/15 | ≈0.5 | ≈0.4 | ≈0.9 | 5.3 |
| G | 8.7 | 45/15 | ≈0.5 | ≈0.4 | ≈0.9 | 4.2 |

The grain size of the Ti(C,N) layers were analysed both as an average in the whole Ti(C,N) layer and in the portion B1 close to the bonding layer. The results are presented in Table 5.

The grain size of the Ti(C,N) layer in the reference sample A was too large to be analysed with XRD, and the Scherrer's equation is not considered valid for grain sizes larger than about 0.2 µm. The average grain size of this layer is larger than 200 nm as measured in a cross section SEM image

TABLE 5

Grain sizes of the Ti(C, N).

| Sample | Average grain size $D_{422}$ in Ti(C, N) layer [nm] | Average grain size in B1 of Ti(C, N) [nm] |
|---|---|---|
| A | n.a | no B1 portion |
| B | 31 | no B1 portion |

TABLE 5-continued

Grain sizes of the Ti(C, N).

| Sample | Average grain size $D_{422}$ in Ti(C, N) layer [nm] | Average grain size in B1 of Ti(C, N) [nm] |
|---|---|---|
| C | 28 | 135 |
| D | 27 | 147 |
| E | 27 | 152 |
| F | 29 | 181 |
| G | 27 | 218 |

(n.a. = not analysed)

Texture coefficients of the Ti(C,N) and the $\alpha$-$Al_2O_3$ layers were analysed using X-ray diffraction and the results are presented in Table 6 and Table 7.

TABLE 6

| | | | Texture coefficients for the α-Al$_2$O$_3$ layer in the samples | | | | | |
|---|---|---|---|---|---|---|---|---|
| Sample | TC(104) | TC(110) | TC(113) | TC(024) | TC(116) | TC(214) | TC(300) | TC(0012) |
| A | 0.02 | 0.25 | 0.01 | 0.07 | 0.01 | 0.03 | 0.00 | 7.61 |
| B | 0.00 | 0.01 | 0.00 | 0.00 | 0.00 | 0.00 | 0.00 | 7.99 |
| C | 0.02 | 0.03 | 0.00 | 0.01 | 0.01 | 0.00 | 0.00 | 7.94 |
| D | 0.01 | 0.07 | 0.00 | 0.02 | 0.00 | 0.00 | 0.00 | 7.89 |
| E | 0.01 | 0.08 | 0.00 | 0.02 | 0.01 | 0.00 | 0.00 | 7.89 |
| F | 0.09 | 0.09 | 0.00 | 0.03 | 0.06 | 0.01 | 0.01 | 7.70 |
| G | 0.03 | 0.17 | 0.00 | 0.05 | 0.03 | 0.01 | 0.00 | 7.72 |

TABLE 7

Texture coefficient TC(422) for the Ti(C, N) layer in the samples

| Sample | TC(422) |
|---|---|
| A | 3.94 |
| B | 3.95 |
| C | 3.43 |
| D | 4.14 |
| E | 4.06 |
| F | 3.19 |
| G | 3.74 |

Performance Tests

The as coated cutting tools were tested in two parallel cutting tests, Cutting test 1 and Cutting test 2, in a longitudinal turning operation in a work piece material Ovako 825B (100CrMo7-3), a high alloyed steel. The cutting speed, Vc, was 220 m/min, the feed, fn, was 0.3 mm/revolution, the depth of cut was 2 mm and water miscible cutting fluid was used. The machining was continued until the end of lifetime criterion was reached. One cutting edge per cutting tool was evaluated.

The tool life criterion was considered reached when the primary or secondary flank wear was >0.3 mm or when the crater area (exposed substrate) was >0.2 mm$^2$. As soon as any of these criteria were met the lifetime of the sample was considered reached. The result of the cutting test is presented in Table 8 and 9.

TABLE 8

| | | Cutting test 1 | |
|---|---|---|---|
| | Flank wear after 30 minutes | | Crater wear |
| Sample | Primary flank wear [mm] | Secondary flank wear [mm] | after 40 minutes Crater area [mm$^2$] |
| A | 0.26 | 0.25 | 0.13 |
| C | 0.25 | 0.24 | 0 |
| D | 0.27 | 0.22 | 0 |
| E | 0.24 | 0.21 | 0 |
| F | 0.29 | 0.27 | 0.04 |
| G | 0.28 | 0.24 | 0.07 |

TABLE 9

| | Cutting test 2 | |
|---|---|---|
| Sample | Time in cut until lifetime [min.] | Lifetime reached due to |
| A | 54 | Crater wear >0.2 |
| D | 86 | Crater wear >0.2 |
| E | 82 | Crater wear >0.2 |

As can be seen in the table 8 all the samples C, D, E, F and G showed a high wear resistance. As shown in table 9 the samples D and E shows a high resistance to both flank and crater wear in metal cutting of steel, also compared with the reference sample A which is a very high performing reference sample.

The cutting tools were also evaluated by being exposed to an abrasive wet blasting. The blasting was performed on the rake faces of the cutting tools. The blaster slurry consisted of 20 vol-% alumina in water and an angle of 90° between the rake face of the cutting insert and the direction of the blaster slurry. The distance between the gun nozzle and the surface of the insert was about 145 mm. The pressure of the slurry to the gun was 1.8 bar for all samples, while the pressure of air to the gun was 2.2 bar. The alumina grits were F230 mesh (FEPA 42-2:2006). The average time for blasting per area unit was 4.4 seconds. Samples B and C could not withstand the wet blasting, the coating of sample B showed severe flaking, the sample C showed spot wise flaking. All the other samples did withstand the wet blasting without destroying the coatings.

While the invention has been described in connection with various exemplary embodiments, it is to be understood that the invention is not to be limited to the disclosed exemplary embodiments, on the contrary, it is intended to cover various modifications and equivalent arrangements within the appended claims. Furthermore, it should be recognized that any disclosed form or embodiment of the invention may be incorporated in any other disclosed or described or suggested form or embodiment as a general matter of design choice. It is the intention, therefore, to be limited only as indicated by the scope of the appended claims appended hereto.

The invention claimed is:

1. A cutting tool comprising a substrate at least partially coated with a coating, said coating including a layer of Ti(C,N), a layer of Al$_2$O$_3$ and there between a bonding layer, wherein said Ti(C,N) layer has a thickness of 3-25 μm and is composed of columnar grains, wherein an average grain size D$_{422}$ of the Ti(C,N) layer is 25-50 nm, as measured with X-ray diffraction with CuKα radiation, the average grain size D$_{422}$ is calculated from the full width at half maximum (FWHM) of the (422) peak according to Scherrer's equation:

13

$$D_{422} = \frac{K\lambda}{B_{422}\cos\theta}$$

wherein $D_{422}$ is the average grain size of the Ti(C,N), K is the shape factor here set at 0.9, $\lambda$ is the wave length for the CuK$\alpha$ radiation here set at 1.5405 Å, $B_{422}$ is the FWHM value for the (422) reflection and $\theta$ is the Bragg angle, wherein the Ti(C,N) layer includes a portion B1 that is adjacent to the bonding layer, and wherein an average grain size of the Ti(C,N) grains in portion B1 is larger than the average grain size $D_{422}$ over a whole thickness of the Ti(C,N) layer, in the portion B1 of Ti(C,N) layer the Ti(C,N) grains has an average grain size of 140-300 nm as measured in the portion B1 of the Ti(C,N) layer, within 0.5 µm from the bonding layer, as measured by counting a number of grains along a line in a SEM micrograph at a 15.000× magnification, wherein said line is parallel with the substrate surface.

2. The cutting tool according claim 1, wherein a thickness of the portion B1 of the Ti(C,N) layer is 0.5-1.5 µm.

3. The cutting tool according to claim 1, wherein the bonding layer includes at least one kind compound selected from the group of titanium carboxide, titanium oxynitride and titanium carboxynitride.

4. The cutting tool according to claim 1, wherein the average grain size $D_{422}$ of Ti(C,N) is 25-40 nm.

5. The cutting tool according to claim 1, wherein the Ti(C,N) layer exhibits an X-ray diffraction pattern, as measured using CuK$\alpha$ radiation and $\theta$-2$\theta$ scan, wherein the TC(hkl) is defined according to Harris formula:

$$TC(hkl) = \frac{I(hkl)}{I_0(hkl)}\left[\frac{1}{n}\sum_{n=1}^{n}\frac{I(hkl)}{I_0(hkl)}\right]^{-1}$$

14 where I(hkl) is the measured intensity (integrated area) of the (hkl) reflection, $I_0$(hkl) is the standard intensity according to ICDD's PDF-card No. 42-1489, n is the number of reflections, reflections used in the calculation are (1 1 1), (2 0 0), (2 2 0), (3 1 1), (3 3 1), (4 2 0) and (4 2 2), wherein TC(422)≥3.

6. The cutting tool according to claim 1, wherein the Al$_2$O$_3$ layer is a $\alpha$-Al$_2$O$_3$ layer having an average thickness of 1 µm-15 µm.

7. The cutting tool according to claim 6, wherein the $\alpha$-Al$_2$O$_3$ layer exhibits a texture coefficient TC(hkl), as measured by X-ray diffraction using CuK$\alpha$ radiation and $\theta$-2$\theta$ scan, defined according to Harris formula where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) characterized in that TC(0 0 12)≥7.5.

8. The cutting tool according to claim 6, wherein said $\alpha$-Al$_2$O$_3$ layer exhibits a texture coefficient TC (110)≤0.2.

9. The cutting tool according to claim 1, wherein in the portion B1 of Ti(C,N) layer the Ti(C,N) grains has an average grain size of 140 nm-175 nm.

10. The cutting tool according to claim 1, wherein an average thickness of the Ti(C,N) layer is 4-20 µm.

11. The cutting tool according to claim 1, wherein an average thickness of the bonding layer is 0.25-2.5 µm.

12. The cutting tool according to claim 1, wherein an average thickness of the coating is 5.0 µm-30.0 µm.

13. The cutting tool according to claim 1, wherein said substrate is a cemented carbide, cermet or ceramic.

* * * * *